(12) United States Patent
Park et al.

(10) Patent No.: US 9,502,478 B2
(45) Date of Patent: Nov. 22, 2016

(54) ORGANIC MATTER VAPOR DEPOSITION DEVICE AND ORGANIC LIGHT EMITTING DISPLAY MANUFACTURED THEREBY

(71) Applicant: Samsung Display Co., Ltd., Yongin (KR)

(72) Inventors: Tong-Jin Park, Suwon-si (KR); Joo Hwa Lee, Bucheon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 126 days.

(21) Appl. No.: 14/280,266

(22) Filed: May 16, 2014

(65) Prior Publication Data

US 2015/0084011 A1 Mar. 26, 2015

(30) Foreign Application Priority Data

Sep. 24, 2013 (KR) ........................ 10-2013-0113340

(51) Int. Cl.
| | |
|---|---|
| H01L 29/08 | (2006.01) |
| H01L 35/24 | (2006.01) |
| H01L 51/00 | (2006.01) |
| H01L 27/32 | (2006.01) |
| C23C 14/04 | (2006.01) |
| C23C 14/12 | (2006.01) |
| C23C 14/54 | (2006.01) |
| B05C 11/00 | (2006.01) |

(52) U.S. Cl.
CPC ......... *H01L 27/3225* (2013.01); *C23C 14/042* (2013.01); *C23C 14/12* (2013.01); *C23C 14/545* (2013.01)

(58) Field of Classification Search
None
See application file for complete search history.

(56) References Cited

U.S. PATENT DOCUMENTS

2009/0096609 A1* 4/2009 Huang ............... B32B 37/02
340/572.1
2010/0207506 A1* 8/2010 Kwon ............ G06K 19/07749
313/323

FOREIGN PATENT DOCUMENTS

| JP | 2007-171028 | 7/2007 |
|---|---|---|
| KR | 10-0709265 | 4/2007 |
| KR | 10-2008-0051255 | 6/2008 |
| KR | 10-2010-0093218 | 8/2010 |

* cited by examiner

*Primary Examiner* — Calvin Choi
(74) *Attorney, Agent, or Firm* — H.C. Park & Associates, PLC

(57) ABSTRACT

An organic material deposition device configured to sense a deposition amount of an organic material deposited in a vacuum chamber by detecting a back propagation characteristic variation of a passive radio frequency identification (RFID) sensor. The organic material deposition device includes: a chamber configured to perform an organic material deposition process therein; a deposition source mounted in the chamber to vaporize an organic material; a deposition mask mounted to face the deposition source and configured to bond a substrate at an opposite side to the deposition source; an antenna mounted in the chamber to receive back propagation from a radio frequency identification (RFID) sensor; and a radio frequency (RF) reader connected to the antenna to measure an organic material deposition amount from a variation of the back propagation.

8 Claims, 5 Drawing Sheets

ORGANIC MATTER VAPOR DEPOSITION DEVICE AND ORGANIC LIGHT EMITTING DISPLAY MANUFACTURED THEREBY

CROSS-REFERENCE TO RELATED APPLICATION

This application claims priority from and the benefit of Korean Patent Application No. 10-2013-0113340, filed on Sep. 24, 2013, which is hereby incorporated by reference for all purposes as if fully set forth herein.

BACKGROUND

Field

Exemplary embodiments of the present invention relate to an organic material deposition device capable of sensing a deposition amount of an organic material deposited in a vacuum chamber, and an organic light emitting diode (OLED) display manufactured thereby.

Discussion of the Background

A quartz crystal microbalance (QCM) sensor is commonly used for sensing a deposition amount of an organic material deposited in a vacuum chamber of an organic material deposition device. The QCM sensor uses a bulk acoustic wave (BAW) method to sense the deposition amount of the organic material by applying a frequency in a range of 2 to 6 MHz.

As the organic material is being deposited, the temperature inside the vacuum chamber increases, thereby deteriorating measurement reliability as a result of the increasing temperature. For example, the available temperature range of the QCM sensor is from 0 to 70° C. As the organic material is accumulated, a temperature increasing effect is generated on a film surface of the QCM sensor, and a condensed film is formed thereon as a result.

Such vacuum deposition may cause a crystal electrode to be deformed and generally stressed, resulting in frequency deviation. When a very high stress is applied to the electrode, a coated organic material condensed film produces a multi-vibration or a couple-vibration. Accordingly, an instantaneous error (e.g., ±100 or 200 Å) may be generated.

As a result, fine adjustment needs to be performed on a contact gap when the QCM sensor is replaced. Therefore, a sensing dispersion (10 to 50 Å) may be varied according to the adjustment on the contact gap of the QCM sensor.

The above information disclosed in this Background section is only for enhancement of understanding of the background of the invention and, therefore, it may contain information that does not constitute prior art.

SUMMARY

Exemplary embodiments of the present invention provide an organic material deposition device having advantages of sensing a deposition amount of an organic material deposited in a vacuum chamber by detecting a back propagation characteristic variation of a passive radio frequency identification (RFID) sensor.

Exemplary embodiments of the present invention also provide an organic light emitting diode (OLED) display manufactured by the organic material deposition device.

Additional features will be set forth in part in the description which follows, and in part will be apparent from the description, or may be learned by practice of the invention.

An exemplary embodiment of the present invention discloses an organic material deposition device including: a chamber configured to perform an organic material deposition process therein; a deposition source mounted in the chamber and configured to vaporize an organic material; a deposition mask mounted so as to face the deposition source and configured to bond a substrate at a side opposite the deposition source; an antenna mounted in the chamber to receive back propagation from a radio frequency identification (RFID) sensor; and a radio frequency (RF) reader connected to the antenna to measure an organic material deposition amount from a variation of the back propagation.

An exemplary embodiment of the present invention also discloses an organic light emitting diode (OLED) display including: a substrate including a display area including an OLED, and a non-display area disposed outside a circumference of the display area; an encapsulation substrate configured to cover the display area and the non-display area and to be attached to the substrate; and an RFID sensor formed in the non-display area of the substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
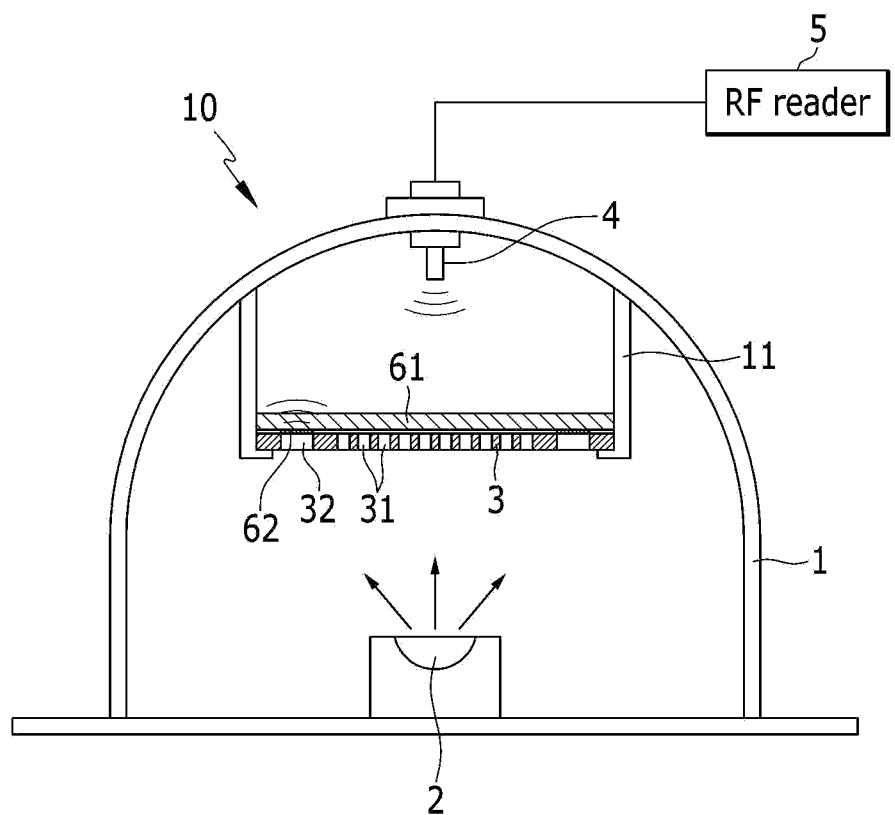
FIG. 1 is a schematic diagram illustrating an organic material deposition device according to an exemplary embodiment of the present invention.

The present invention will be described more fully hereinafter with reference to the accompanying drawings, in which exemplary embodiments of the invention are shown. This invention may, however, be embodied in many different forms and should not be construed as being limited to the embodiments set forth herein. Rather, these embodiments are provided so that this disclosure is thorough, and will fully convey the concept of the invention to those skilled in the art. Like reference numerals in the drawings denote like elements.

In the drawings, the thickness of layers, films, panels, regions, etc., are exaggerated for clarity. In the drawings, for better understanding and ease of description, the thickness of some layers and areas is exaggerated. It will be understood that when an element, layer, film, plate, or the like is referred to as being "on", "over", "connected to", or "coupled to" another element, it can be directly on, over, connected to, or coupled to the other element, or intervening elements may be present. In contrast, when an element, layer, film, plate, or the like is referred to as being "directly on", "directly over", "directly connected to", or "directly coupled to" another element, there are no intervening elements present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Figure 2:
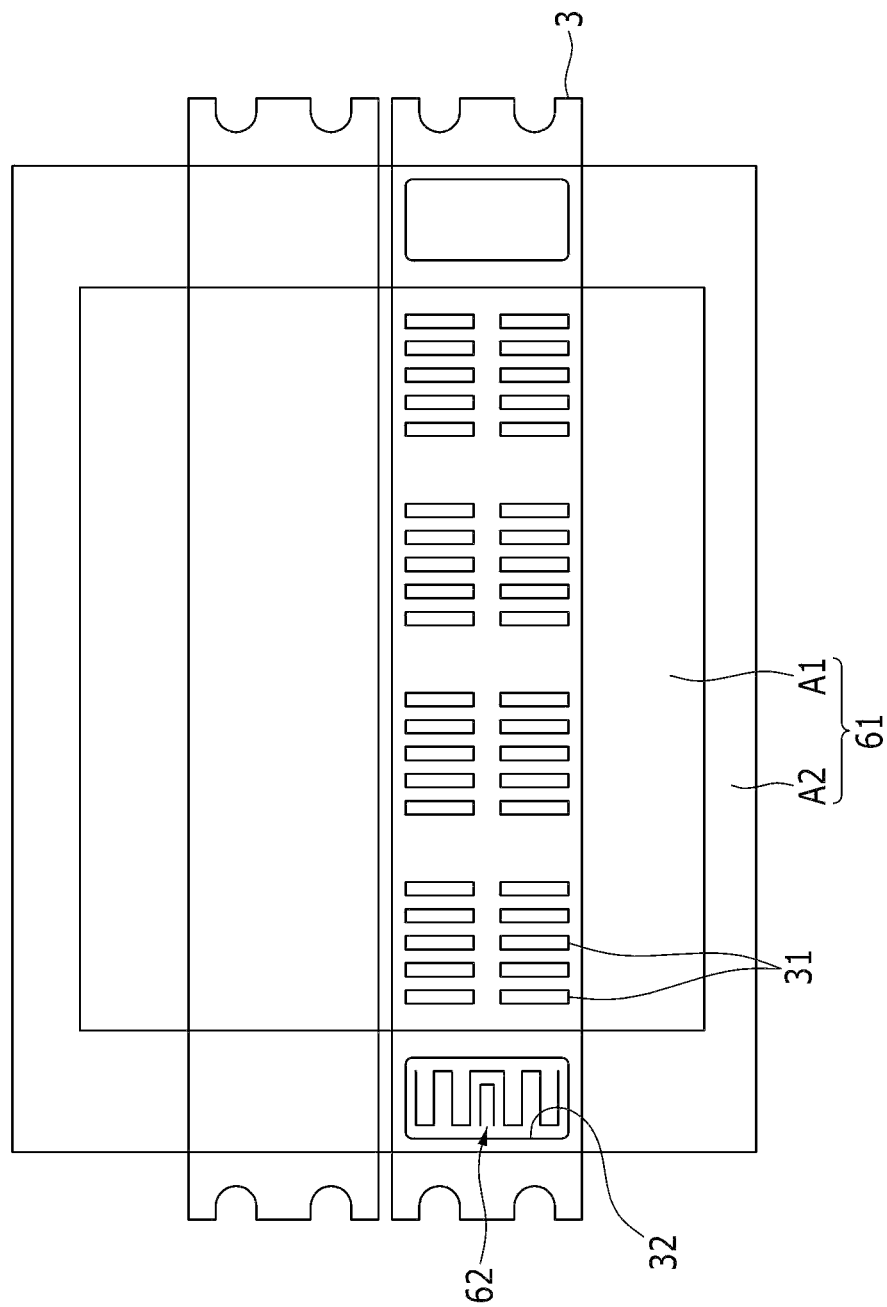
FIG. 2 is a bottom view showing a substrate on which a deposition mask is bonded.

FIG. 1 is a schematic diagram showing an organic material deposition device 10 in accordance with an exemplary embodiment of the present invention, and FIG. 2 is a bottom view showing a substrate on which a deposition mask 3 is bonded. Referring to FIG. 1 and FIG. 2, the organic material deposition device 10 includes a chamber 1 configured to perform an organic material deposition process therein, a deposition source 2 mounted in the chamber 1 to vaporize an organic material, a deposition mask 3, an antenna 4, and a radio frequency (RF) reader 5.

Figure 6:
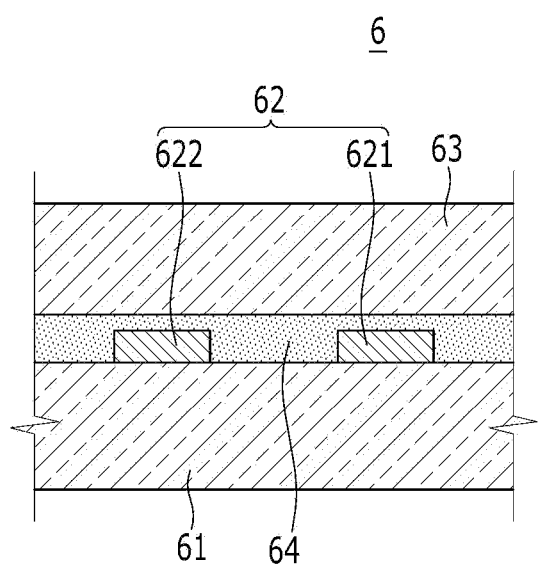
FIG. 6 is a partial cross-sectional view showing an organic light emitting diode (OLED) display in which an organic material is deposited on the RFID sensor shown in FIG. 5.

The chamber 1 includes the deposition source 2 disposed internally at a lower portion thereof, and a support member 11 disposed at an upper portion thereof to support the deposition mask 3. A substrate 61 for an organic light emitting diode (OLED) display 6 shown in FIG. 6 is bonded to the deposition mask 3.

The deposition mask 3 is mounted to the support member 11 in such a way that its bottom surface faces the deposition source 2, and its top surface, which supports the substrate 61, is bonded to the substrate 61 at an opposite side thereof to the deposition source 2. The deposition mask 3 has holes through which the organic material injected or vaporized from the deposition source 2 passes. Accordingly, the deposition source 2 facilitates formation of an organic material pattern on the substrate 61 through the holes of the deposition mask 3.

The deposition mask 3 may include, e.g., display holes 31 which facilitate deposition of the organic material on a display area A1 of the substrate 61, formed to face the display area A1, and dummy holes 32 which facilitate deposition of the organic material on a non-display area A2 of the substrate 61, formed to face the non-display area A2.

A radio frequency identification (RFID) 62 sensor is provided in the substrate 61. The electrostatic capacity of the RFID sensor 62 is varied depending on a deposition amount of the organic material. Accordingly, an LC (inductor/capacitor) resonance frequency, i.e., back propagation, is changed and radiated.

The antenna 4 may be mounted in the chamber 1 to receive the back propagation radiated from the RFID sensor 62. As a result, the antenna 4 facilitates wireless measurement of LC resonance frequency variation of the RFID sensor 62.

The RFID sensor 62 is formed in the non-display area A2 of the substrate 61. Accordingly, the RFID sensor 62 changes the LC resonance frequency according to an amount of an organic material 64 deposited through the dummy holes 32 of the non-display area A2, to correspond to the dummy holes 32 of the deposition mask 3, and radiates the changed LC resonance frequency.

Although not shown, RFID sensors may be provided at multiple locations in the non-display area of the substrate, to determine the uniformity of the organic material deposited in the display area.

The RF reader 5 is mounted outside the chamber 1 and is connected to the antenna 4 by a wire. Accordingly, the LC resonance frequency wirelessly received from the RFID sensor 62 by the antenna 4 is transmitted to the RF reader 5 through the antenna 4.

The RF reader 5 can measure a deposition amount of the organic material 64 deposited in the non-display area A2 from the LC resonance frequency variation. As a result, the deposition amount of the organic material deposited in the display area A1 can be indirectly measured from the deposition amount of the organic material 64 deposited in the non-display area A2.

Figure 3:
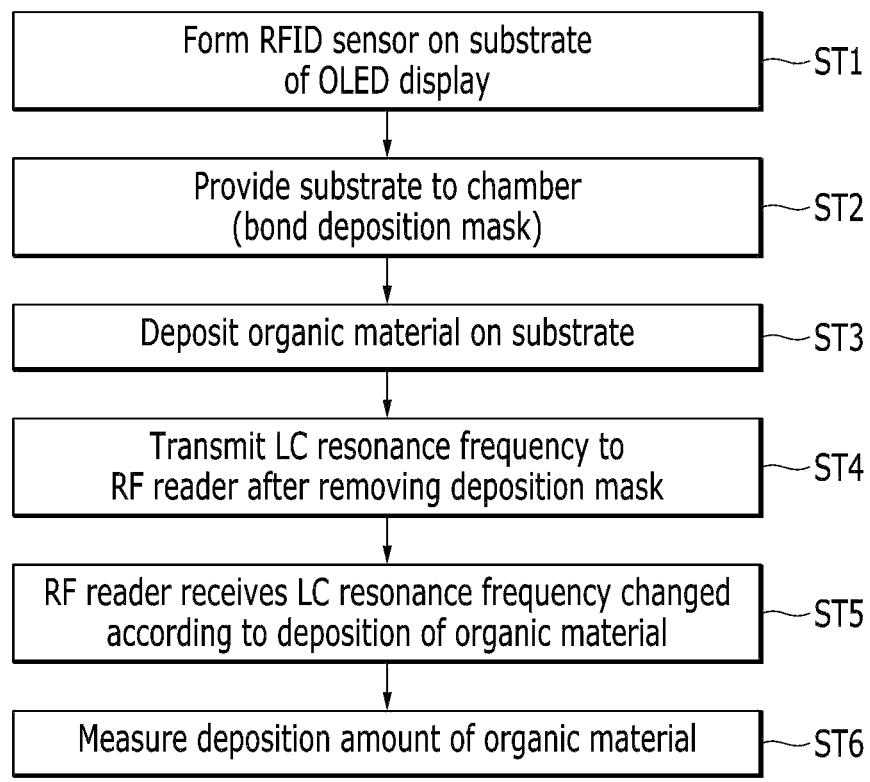
FIG. 3 is a flowchart showing a measuring method of an organic material deposition amount by using the organic material deposition device shown in FIG. 1.

FIG. 3 is a flowchart showing a measuring method of an organic material deposition amount by using the organic material deposition device 10 shown in FIG. 1. A measuring method of the organic material deposition amount will now be described with reference to FIG. 3. The measuring method of the organic material deposition amount may include steps ST1 to ST6.

In the first step ST1, the RFID sensor 62 is formed in the substrate 61 in which a part of the OLED display 6 is formed. For example, the RFID sensor 62 may be formed by a process in which a pattern is formed of a metal among a plurality of processes that are required when an OLED is formed on the substrate 61. In other words, it is not necessary to additionally include a process for forming the RFID sensor 62 in the substrate 61.

In the second step ST2, the substrate 61, including the RFID sensor 62, is provided to the chamber 1. Specifically, the substrate 61 bonded to the deposition mask 3 is provided to the chamber 1 and is mounted in the support member 11. The deposition mask 3 is supported to maintain a horizontal orientation so as to face the deposition source 2.

In the third step ST3, the organic material 64 is deposited on the substrate 64 in the state of the second step ST2. Specifically, the organic material vaporized in the deposition source 2 is deposited on the display area A1 through the display holes 31 of the deposition mask 3, and deposited on the non-display area A2 through the dummy holes 32. In this case, the organic material is also deposited on the RFID sensor 62 in the non-display area A2 of the substrate 61. The LC resonance frequency of the RFID sensor 62 is changed by the organic material 64 deposited on the RFID sensor 62.

In the fourth step ST4, the deposition mask 3 is removed from the substrate 61 on which the organic material is deposited, and then the LC resonance frequency changed in the RFID sensor 62 of the substrate 61 is transmitted to the RF reader 5. The antenna 4 wirelessly transmits the LC resonance frequency radiated from the RFID sensor 62 to the RF reader 5.

In the fifth step ST5, the RF reader 5 receives the LC resonance frequency changed according to the deposition amount of the organic material 64. In the sixth step ST6, the deposition amount of the organic material 64 can be measured through a variation of the LC resonance frequency received by the RF reader 5.

Figure 4:
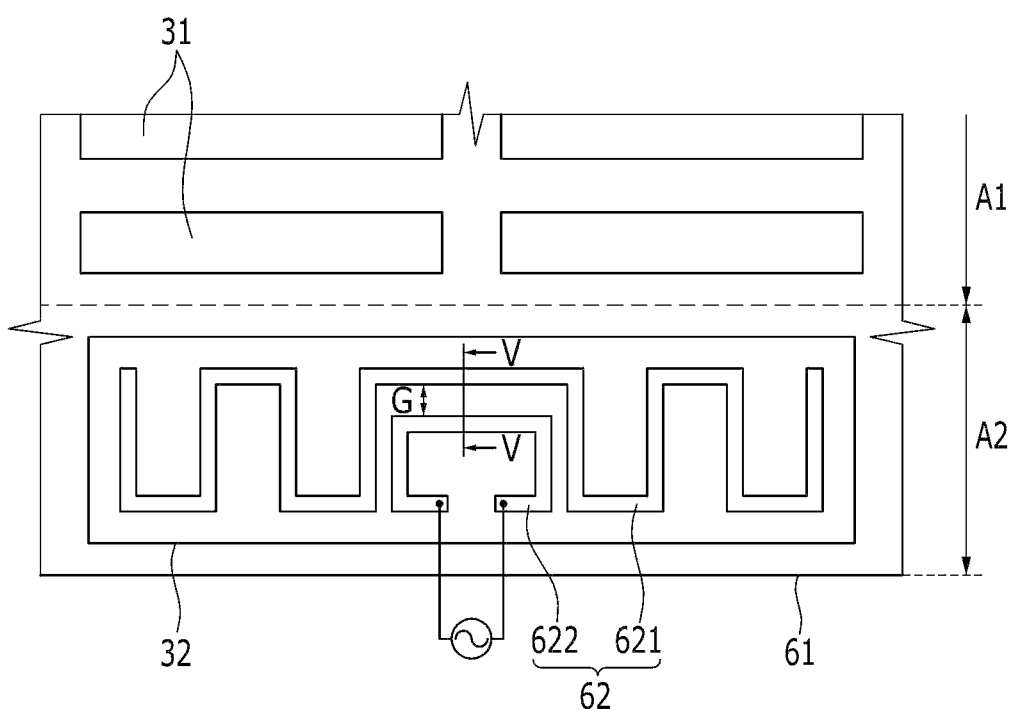
FIG. 4 is a top view showing an RFID sensor deposited on the substrate shown in FIG. 2.
Figure 5:
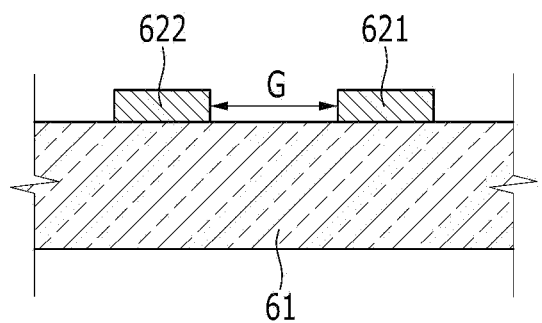
FIG. 5 is a cross-sectional view showing the RFID sensor taken along a line V-V of FIG. 4.

FIG. 4 is a top view showing an RFID sensor deposited on the substrate shown in FIG. 2, FIG. 5 is a cross-sectional view showing the RFID sensor taken along a line V-V of FIG. 4, and FIG. 6 is a partial cross-sectional view showing an organic light emitting diode (OLED) display in which an organic material is deposited on the RFID sensor shown in FIG. 5. The OLED display 6 of the present exemplary embodiment will be described with reference to FIG. 4 to FIG. 6.

The OLED display 6 includes the substrate 61, an encapsulation substrate 63, and the RFID sensor 62. Each of the substrate 61 and the encapsulation substrate 63 includes a display area A1 including OLEDs (not shown), and a non-display area A2 formed outside a circumference of the display area A1. The encapsulation substrate 63 covers the display area A1 and the non-display area A2 formed on the substrate 61, and is attached to the substrate 61.

The RFID sensor 62 may be formed as a metal pattern on the non-display area A2 of the substrate 61. Accordingly, in the non-display area A2, the RFID sensor 62 is covered with the organic material 64 vaporized in the organic material deposition process in which the OLEDs are formed.

For example, the RFID sensor 62 includes an output section 621 configured to transmit back propagation, and an input section 622 spaced from the output section 621 by a gap G, thereby forming a capacitor to apply a preselected frequency.

The output section 621 and the input section 622 are insulated from each other by the gap G so as to form a capacitor. The electrostatic capacity of the capacitor is changed as the organic material 64 is deposited around the gap. The output section 621 forms an inductor.

A preselected frequency is continuously applied to the input section 622. For example, a frequency of 1.7 GHz may be applied to the input section 622. In this state, the organic material is deposited in the gap G, and thus, the electrostatic capacity is changed. As a result, the LC resonance frequency is changed in the output section 621. The changed LC resonance frequency is radiated by the output section 621 and is wirelessly received by the antenna 4.

Although not shown, the output section and the input section constituting the RFID sensor may be formed to have a variety of patterns.

In the present exemplary embodiment, the deposition amount of the organic material 64 can be directly measured in the substrate 61 in a wireless manner, and the RFID sensor 62 can be formed in a small pattern by using a super-high frequency band (1.7 GHz). The RFID sensor 62 may be formed in the same pattern as that of the OLEDs that are formed in the display area A1 during the process in which the OLEDs are formed.

For example, a conventional QCM sensor has sensitivity of 0.014, an operating frequency of 6 MHz, and a detection limitation of 0.6 µg. In contrast, the RFID sensor 62 of the present invention has higher sensitivity of 0.5, a higher operating frequency of 1.7 GHz, and a detection limitation below 0.6 µg.

According to the present invention, it is possible to sense the deposition amount of the organic material deposited in the vacuum chamber by providing the RFID sensor in the substrate, and sensing the back propagation (variation of LC resonance frequency) of the RFID sensor, which is varied according to the deposition of the organic material.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic material deposition device comprising:
a chamber;
a deposition source mounted in the chamber and configured to vaporize an organic material;
a deposition mask disposed in the chamber facing the deposition source;
a substrate disposed on a surface of the deposition mask that faces away from the deposition source;
a radio frequency identification (RFID) sensor disposed in the substrate;
an antenna disposed in the chamber and configured to receive back propagation from the RFID sensor; and
a radio frequency (RF) reader connected to the antenna and configured to measure a deposition amount of organic material by detecting a variation of the back propagation.

2. The organic material deposition device of claim 1, wherein the deposition mask comprises:
a display hole formed to face a display area of the substrate; and
a dummy hole formed to face a non-display area of the substrate disposed outside the circumference of the display area,
wherein the dummy hole faces the RFID sensor.

3. An organic light emitting diode (OLED) display comprising:
a substrate comprising:
a display area comprising an OLED; and
a non-display area disposed outside a circumference of the display area;
an encapsulation substrate attached to the substrate and covering the display area and the non-display area; and
an RFID sensor disposed in the non-display area of the substrate,
wherein the RFID sensor comprises:
an output section configured to transmit back propagation; and
an input section spaced apart from the output section to form a gap, such that the input section and the output section form a capacitor.

4. The OLED display of claim 3, wherein, in the non-display area, the RFID sensor is covered by an organic material of which the OLED is formed.

5. The OLED display of claim 3, wherein the input section is configured to input an electrical signal having a preselected frequency.

6. The OLED display of claim 3, the output section forms an inductor.

7. The OLED display of claim 6, wherein the capacitor and the inductor are configured to form an inductor/capacitor (LC) resonance circuit, and the output section is configured to wirelessly radiate an LC resonance frequency to the antenna.

8. The OLED display of claim 7, wherein the LC resonance frequency is varied according to the amount of deposition of the organic material in the gap, and is transmitted to the antenna as the back propagation.

* * * * *